United States Patent [19]

Sekino et al.

[11] Patent Number: 5,148,401
[45] Date of Patent: Sep. 15, 1992

[54] DRAM WITH SPLIT WORD LINES

[75] Inventors: Yoshimasa Sekino; Yoshihiro Murashima, both of Tokyo, Japan

[73] Assignee: Oki Electric Industry Co., Ltd., Tokyo, Japan

[21] Appl. No.: 762,548

[22] Filed: Sep. 18, 1991

Related U.S. Application Data

[63] Continuation of Ser. No. 473,928, Feb. 1, 1990, abandoned.

[30] Foreign Application Priority Data

Feb. 2, 1989 [JP] Japan .................................. 1-24242

[51] Int. Cl.$^5$ ............................................. G11C 13/00
[52] U.S. Cl. .................... 365/230.03; 365/51; 365/189.04; 365/207; 365/230.06
[58] Field of Search ...................... 365/189.04, 230.06, 365/230.03, 51, 207

[56] References Cited

U.S. PATENT DOCUMENTS 3,402,398  9/1968  Koerner et al. ..................... 365/207
4,330,852  5/1982  Redwine et al. ..................... 365/207

Primary Examiner—Terrell W. Fears
Attorney, Agent, or Firm—Edward D. Manzo

[57] ABSTRACT

In a dynamic random access memory comprising first and second memory cell arrays, and a plurality of word lines, each split into two sections extending through the first and the second memory cell arrays, respectively, word line drive circuits are divided into three blocks. The first block is disposed between the inner sides of the memory cell arrays and connected to the inner ends of the alternate word line sections. The second and the third blocks are disposed adjacent to the outer sides of the memory cell arrays and are connected to the outer ends of the intervening word line sections. Because the word line drive circuits for the respective word lines are disposed on both sides of each memory cell array, alternately, the area for the word line drive circuit for each word line can extend twice the pitch of the word lines. Thus, the pitch of the word lines can be reduced, or the size of the word line drive transistors can be increased, enabling a higher degree of integration.

41 Claims, 4 Drawing Sheets

DRAM WITH SPLIT WORD LINES

This is a continuation of application Ser. No. 07/473,928, filed Feb. 1, 1990, now abandoned.

BACKGROUND OF THE INVENTION

The present invention relates to a dynamic random access memory (DRAM) of a split word line drive configuration, and particularly to an improvement in the layout of the word line drive circuit A variety of DRAMs have been proposed one being disclosed in Japanese Patent Application Kokoku Publication 1714/1985. FIG. 1 shows an example employing the folded-bit line configuration and the split word line drive configuration.

The DRAM shown in FIG. 1 comprises first and second memory cell arrays 1-1 and 1-2 disposed on the left and on the right as seen in the figure. Word line drive circuits are disposed in a block 2 between the memory cell arrays 1-1 and 1-2. First and second blocks of sense amplifiers 8-1 and S-2 are disposed on the top sides 1-1c and 1-2c and on the bottom sides 1-1d and 1-2d of the memory cell arrays 1-1 and 1-2.

The word line drive circuits in the block 2 drive the word lines in the first and the second memory cell arrays, and are activated by the output lines 4-1, 4-2 etc. of a row decoder B which decodes a row address ADr.

Because the time taken for the word lines to be fully raised after the corresponding decoder output lines rise determines the access time of the DRAM, it must be short enough. As the degree of integration is increased, however, the number of memory cells connected to each word line is increased, and the word line drive circuit, particularly the transistors therein are required to have a larger capacity. This means that the area each drive transistor must occupy is enlarged. On the other hand, it is also required that the pitch of the word lines be reduced for a higher degree of integration. Thus, to increase the degree of integration two contradictory requirements are encountered: on one hand, larger areas are needed for the drive circuits for a larger driving capacity and, on the other hand, the areas for the drive circuits must be confined in a smaller vertical extension (dimension in the direction orthogonal to the word lines).

SUMMARY OF THE INVENTION

An object of the invention is to increase the degree of integration by reducing the pitch of the word lines while enlarging the size of the word line drive circuits.

A DRAM according to the invention comprises first and second memory cell arrays having inner sides adjacent to each other and outer sides opposite to each other, and a plurality of word lines, each split into two sections extending through the first and the second memory cell arrays, respectively, and having inner ends adjacent to each other and outer ends opposite to each other. Word line drive circuits are divided into three blocks. The first block is disposed between the inner sides of the memory cell arrays and is connected to the inner ends of the sections of the alternate word lines. The second and the third blocks are disposed adjacent to the outer sides of the memory cell arrays and are connected to the outer ends of the sections of the intervening word lines.

Because the word line drive circuits for the respective word lines are disposed between the arrays and outside the arrays, alternately, the area occupied by the word line drive circuit for each word line can extend twice the pitch of the word lines. Thus, the pitch of the word lines can be reduced and/or the size of the word line drive transistors can be increased.

DETAILED DESCRIPTION OF THE PREFERRED EMBODIMENTS

Overall Layout

Figure 1:
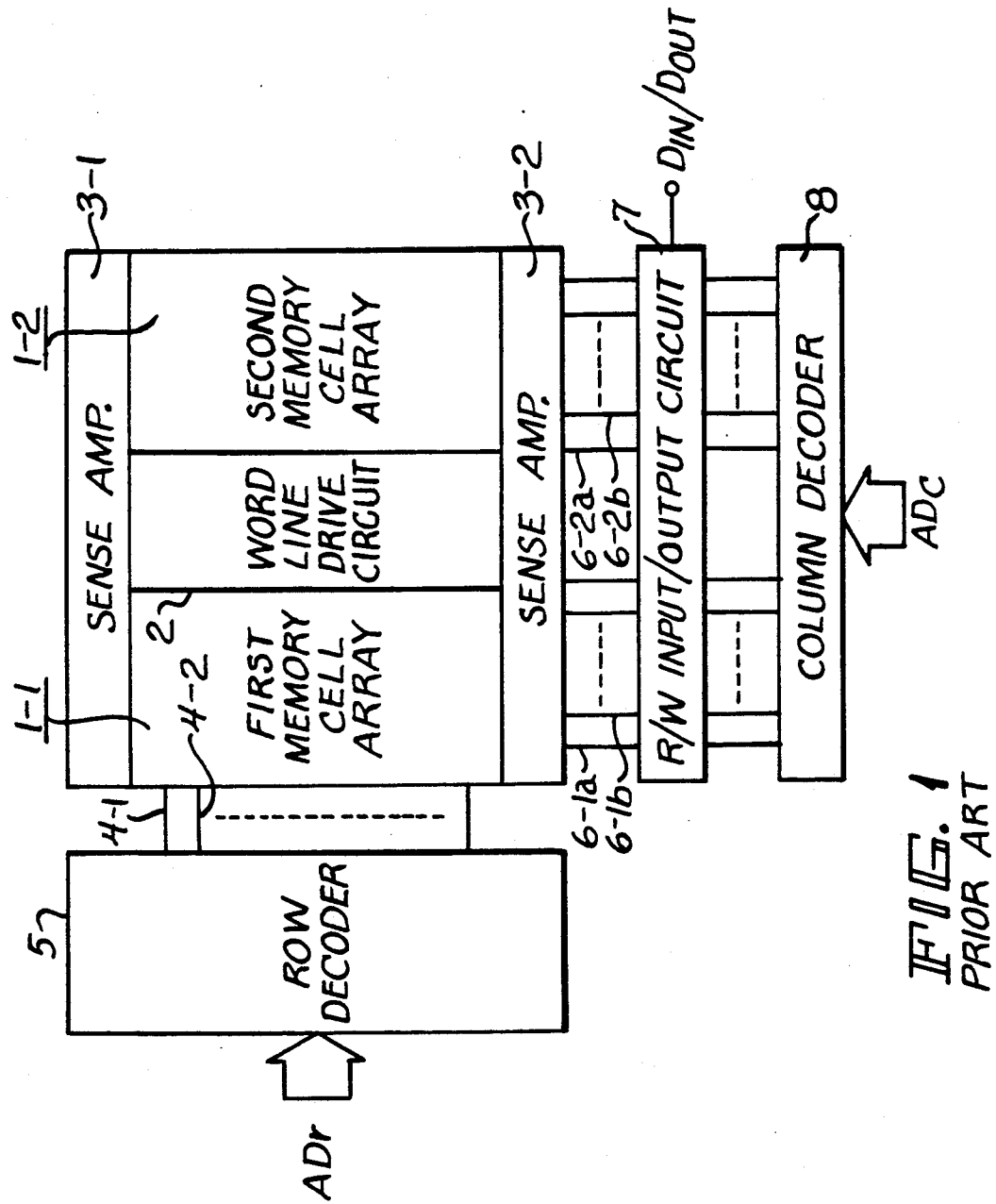
FIG. 1 shows a layout of a conventional DRAM.
Figure 2:
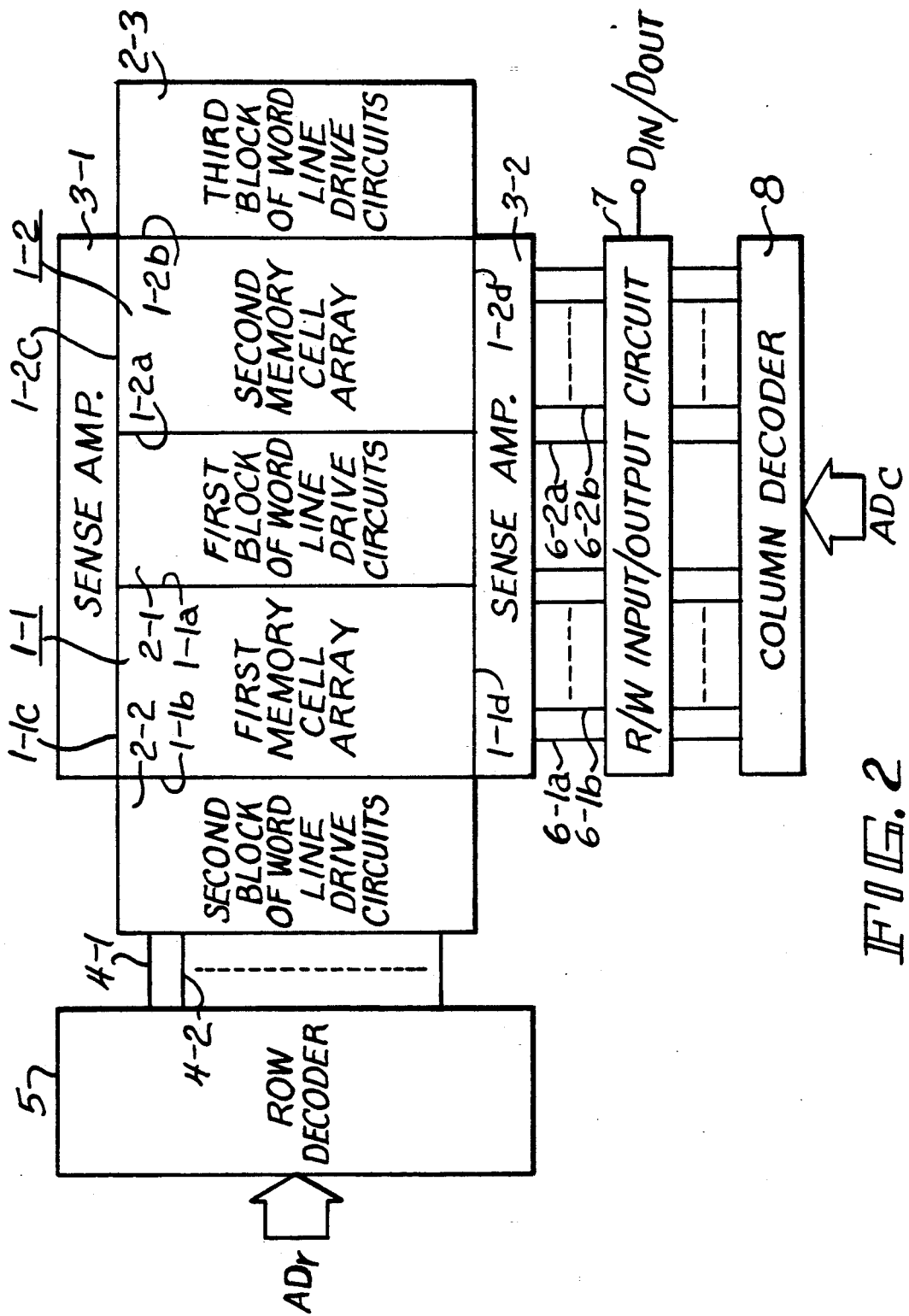
FIG. 2 shows a layout of a DRAM according to the invention.
Figure 3:
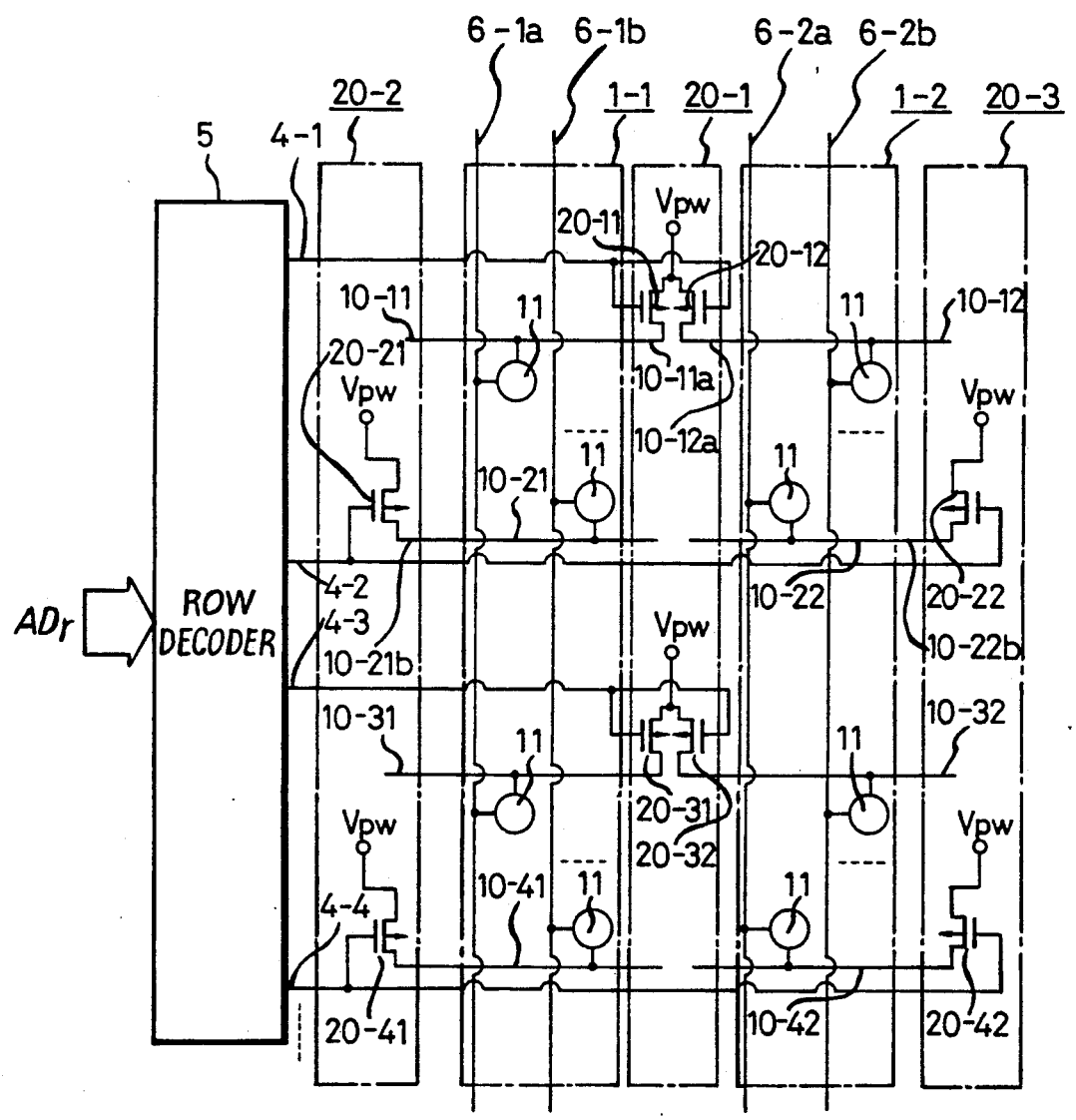
FIG. 3 shows part of the bit lines, the word lines and memory cells in the memory cell arrays, and the word line driver transistors.

As shown in FIG. 2, a DRAM of this embodiment comprises first and second memory cell arrays 1-1 and 1-2 disposed on the left and on the right as seen in the figure. The first and the second memory cell arrays 1-1 and 1-2 have first or inner sides 1-1a and 1-2a adjacent to each other and second or outer sides 1-1b and 1-2b opposite to each other.

Word line drive circuits are divided into first, second and third blocks 2-1, 2-2 and 2-3. The first block 2-1 of word line drive circuits are provided between the first sides 1-1a and 1-2a of the first and the second memory cell arrays 1-1 and 1-2. The second block 2-2 of word line drive circuits are disposed adjacent to the second side 1-1b of the first memory cell array 1-1. The third block 2-8 of word line drive circuits are disposed adjacent to the second side 1-2b of the second memory cell array 1-2.

First and second blocks of sense amplifiers 3-1 and 3-2 are disposed adjacent to third or top sides 1-1c and 1-2c, and fourth or bottom sides 1-1d and 1-2d of the memory cell arrays 1-1 and 1-2.

Bit Lines

As is better illustrated in reference FIG. 8, a first group of bit lines 0-1a B-1b, etc. extends through the first memory cell array 1-1. A second group of bit lines 6-2a, 6-2b, etc. extends through the second memory cell array 1-2. The illustrated memory is a folded bit line configuration, connected to a pair of data nodes of a sense amplifier, to be described later. In FIG. 2, the further bit lines of the bit line groups are indicated generally by dashes.

Word lines

Word lines are split at their centers into first and second sections 10-11, 10-12, 10-21, 10-22, 10-31, 10-32, 10-41, 10-42, etc. The first and the second sections. e.g., 10-11 and 10-12, of each word line extend in the first and the second memory cell arrays 1-1 and 1-2, respectively, are aligned with each other, have their first or inner ends adjacent each other, and have their second or outer ends opposite to each other.

Word Line Drive Circuits

The word line drive circuits of the block 2-1 are disposed at the center of the alternating respective word lines, i.e., between the inner ends. e.g., 10-11a and 10-12a, of the sections 10-11 and 10-12 of the alternate word lines. The word line drive circuits of the blocks 2-2 and 2-3 are disposed at the outer ends e.g., 10-21b and 10-22b, of the sections 10-21 and 10-22, of the intervening word lines. In other words, the word line drive circuits for the respective word lines are disposed at the center and at the ends of the corresponding word lines, alternately, in the direction of the bit lines.

More specifically, the first sections, 10-11, 10-81, etc., of alternate word lines, e.g., odd-numbered word lines, lie in the first memory cell array 1-1, and their inner ends extend into the first block 2-1 of the word line drive circuits, and are connected to the word line drive circuits provided therein.

The first sections 10-21, 10-41 etc., of the intervening word lines, e.g., the even-numbered word lines, lie in the first memory cell array 1-1, and their outer ends extend into the second block 2-2 of the word line drive circuits and are connected to the word line drive circuits provided therein.

The second sections 10-12, 10-32 etc., of the alternate word lines, e.g., the odd-numbered word lines, lie in the second memory cell array 1-2, and their inner ends extend into the first block 2-1 of the word line drive circuits and are connected to the word line drive circuits provided therein.

The second sections 10-22, 10-42, etc., of the intervening word lines, e.g., the even-numbered word lines, lie in the second memory cell array 2-2, and their outer ends extend into the third block 2-2 of the word line drive circuits and are connected to the word line drive circuits provided therein.

In this way, the odd-numbered word line sections 10-11, 10-12, 10-31, 10-32, etc, are connected to the drive circuits of the first block 2-1 and the even-numbered word line sections 10-21, 10-22, 10-41, 10-42, etc. are connected to the drive circuits of the second and the third drive blocks 2-2 and 2-3.

The word line drive circuits comprise word line drive transistors, which in this embodiments are PMOS transistors, 20-11, 20-12, etc.

The sources of the PMOS transistors are connected to a node of a fixed potential Vpw which is higher than the power supply voltage Vcc, and their gates are connected to the corresponding output lines, 4-1, 4-2, 4-3, 4-4, etc., from the row decoder 5, and their drains are connected to the corresponding word line sections.

The PMOS transistors of the block 2-1 provided between the arrays 1-1 and 1-2 are for the odd-numbered word line sections (e.g., 10-11 and 10-12), in both the first and the second memory cell arrays 1-1 and 1-2, as described above, and the drains of the PMOS transistors of the block 2-1 are connected to the respective word line sections in both of the memory cell arrays 1-1 and 1-2. For example, the drains of the PMOS transistors 20-11 and 20-22 are connected to the word line sections 10-11 and 10-12. Similarly, the drains of the PMOS transistors 20-31 and 20-32 are connected to the respective word line sections 10-31 and 10-32.

The PMOS transistors of the block 2-2 provided to the left of the first memory cell array 1-1 are for the even-numbered word line sections (e.g., 10-21 and 10-22), in the first memory cell array 1-1, described above, and the drains of the PMOS transistors of the second block 2-2 are connected to the corresponding word line sections in the first memory cell array 1-1. For example, the drain of the PMOS transistor 20-21 is connected to the word line section 10-21. Similarly, the drain of the PMOS transistor 20-41 is connected to the word line section 10-41.

The PMOS transistors of the block 2-3 provided to the right of the second memory cell array 1-2 are for the even-numbered word line sections (e.g., 10-22 and 10-42), in the second memory cell array 1-2, as described above, and the drains of the PMOS transistors of the block 2-3 are connected to the corresponding word line sections in the second memory cell array 1-2. For example, the drain of the PMOS transistor 20-22 is connected to the word line section 10-22. Similarly, the drain of the PMOS transistor 20-42 is connected to the word line section 10-42.

The PMOS transistors are connected to receive the output signals 4-1, 4-2, 4-2, 4-4, etc. from the row decoder 5 as described above, to be controlled thereby.

More specifically, the gates of the PMOS transistors, e.g., 20-11. 20-12, etc., provided in the first block 2-1 and connected to the first and the second sections, e.g., 10-11 and 10-12, of alternate word lines are connected to receive an identical output signal, e.g., 4-1, from the row decoder 5.

The gates of the PMOS transistors, e.g., 20-21, 20-23, provided in the second and the third blocks 2-2 and 2-3 and connected to the first and the second sections, e.g., 10-21 and 10-22, of the intervening word lines are connected to receive an identical output signal, e.g., 4-2, from the row decoder 5.

Memory Cells

Memory cells 11 are disposed at intersections of odd-numbered word line sections 10-11, 10-12, 10-31, 10-32, etc., and first bit lines, 6-1a, 6-2a, etc. of bit line pairs, and at intersections of even-numbered word line sections 10-21, 10-22, 10-41, 10-42, etc., and second bit lines, 6-1b, 6-2b, etc. of bit line pairs. The memory cells are not disposed at every intersection because the memory is of the folded-bit line configuration. Dummy cells, not shown, are also connected to the respective bit lines for providing a reference voltage Vcc/2.

Other Circuit Components

The row decoder S decodes the row address ADr, and selectively lowers one of the output lines 4-1, 4-2, etc. to a Low level in accordance with the row address ADr.

The sense amplifiers in the blocks 3-1 and 3-2 are connected to respective pairs of bit lines B-1a, B-1b; 6-2a, 6-2b; etc., and are also connected through a read/-write input/output circuit 7 to a column decoder 8 which decodes a column address ADc.

Other circuit, such as refresh circuits and read/write input/output control circuits are provided but not shown for the sake of simplicity of illustration.

Operation

Figure 4:
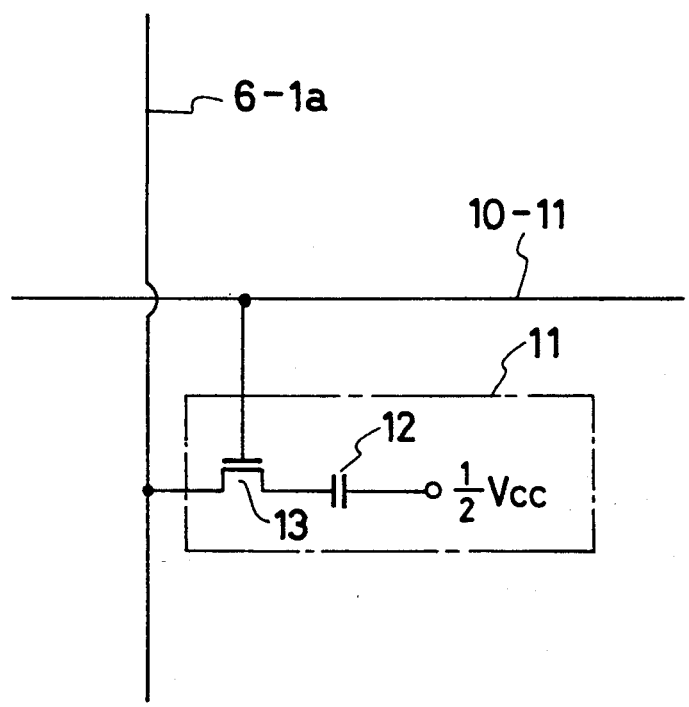
FIG. 4 shows a circuit of a memory cell.

As shown in FIG. 4, each memory cell 11 is of the one-transistor type, and comprises a charge storage capacitor 12 connected to a fixed potential Vcc/2, and a transfer gate 18 formed of an NMOS transistor and connected between the capacitor 12 and the bit line, e.g., 6-1a, for transferring the charge.

When data is to be read from a memory cell 11, a row address ADr is decoded by the row decoder 5 and one of its output lines 4-1, 4-2, etc., corresponding to the word line selected by the row address ADr, is made Low. Then, the PMOS transistors 2-11 and 2-12 are turned on, and the word line sections 10-11 and 10-12 are thereby raised to the fixed potential Vpw. When the word line sections 10-11 and 10-12 are raised to the fixed potential Vpw, all the transfer gates 13 connected to the word line sections of the selected word line are turned on to permit transfer of data between the corresponding capacitors 12 and the bit lines 6-1a, 6-2a, etc. Assuming that the word line sections 10-11 and 10-12 are raised to the fixed potential Vpw during reading, the data stored on the capacitors 12 of the memory cells connected to the word line sections 10-11 and 10-12 are transferred to the respective bit lines 6-1a, 6-2a, etc. Data from corresponding dummy memory cells not shown, connected to the complementary bit lines 6-1b 6-1b, etc. (i.e., the bit lines which form pairs with the first mentioned bit lines 6-1a, 6-2a, etc.) are simultaneously transferred to the complementary bit lines 6-1b, 6-2b, etc. The sense amplifiers 3-1, 3-2 amplifies the potential differences between the bit lines of the respective pairs, and one of the amplified data is selected by the output of the column decoder 8 for decoding the column address ADc, and output through the R/W I/O circuit 7 as an output data Dout.

Advantages

With the configuration described above, the word line drive circuits are divided into three blocks 2-1. 2-2 and 2-3, between the arrays 1-1 and 1-2, to the left of the first memory cell array 1-1, and to the right of the second memory cell arrays 1-2, and the drive circuits for the odd-numbered word lines are disposed in the central block 2-1, while the drive circuits for the even-numbered word lines are disposed in the outer blocks 2-2 and 2-3. The drive circuit for each word line can occupy the space (vertical extension) for two word lines, i.e., twice the pitch of the word lines. In other words, the vertical dimension of the area which each drive circuit can occupy is twice the pitch of the word lines. This means, the size of the word line drive transistor can be increased and/or the pitch of the word lines can be reduced. Accordingly, the degree of the integration can be heightened without sacrificing the access speed.

Modifications

In the embodiment described above the word line drive circuit comprises PMOS transistors. Use of the PMOS transistors is advantageous since the word line can be raised to a potential Vpw higher than the power supply potential Vcc. If NMOS transistors having a threshold voltage Vt are used the word lines cannot be raised higher than Vpw-Vt. However, if the transfer gate 13 of the memory cell is of such a characteristics that it can be turned on with the potential Vpw-Vt, then such NMOS transistors can be used for the word line drive circuits. The NMOS transistors may also be used for the word line drive circuits with a special arrangement, in which the gate potential of the NMOS transistor is controlled so that the word line is raised to a level close to the fixed potential Vpw.

In the above embodiment, the memory cell is of a one-transistor type, but the invention is applicable to a memory with two-transistor memory cells. Moreover, the overall configuration of the memory may be other than that shown in FIG. 2.

What is claimed is:

1. A dynamic random access memory comprising
   first and second memory cell arrays having inner sides adjacent each other and outer sides opposite to each other:
   a plurality of word lines, each split into two sections extending through the first and the second memory cell arrays, respectively, and having inner ends adjacent each other and outer ends opposite to each other;
   a first block of word line drive circuits being disposed between the inner sides of the memory cell arrays and connected to the inner ends of the sections of the sequentially alternating word lines; and
   second and third blocks of word line drive circuits disposed adjacent the outer sides of the memory cell arrays and connected to the outer ends of the sections of the intervening word lines.

2. A dynamic random access memory of a split word line configuration, comprising:
   first and second memory cell arrays having first sides adjacent each other and second sides opposite to each other:
   word lines extending through the first and the second memory cell arrays, each word line being split into first and second sections aligned with each other, respectively extending through the first and the second memory cell arrays, and having their inner ends adjacent each other and their outer ends opposite to each other;
   a first block of word line drive transistors provided between said first sides of the first and the second memory cell arrays;
   a second block of word line drive transistors disposed adjacent said second side of the first memory cell array; and
   a third block of word line drive transistors disposed adjacent said second side of the second memory cell array;
   alternate ones of said first sections of the word lines in said first memory cell array having said inner ends extending into said first block of word line drive transistors and connected to the word line drive transistors provided therein;
   intervening ones of said first sections of the word lines in said first memory cell array having said outer ends extending into said second block of word line drive transistors and connected to the word line drive transistors provided therein;
   alternate ones of said second sections of the word lines in said second memory cell array having said inner ends extending into said first block of word line drive transistors and connected to the word line drive transistors provided therein; and
   intervening ones of said second sections of the word lines in said second memory cell array having said outer ends extending into said third block of word line drive transistors and connected to the word line drive transistors provided therein.

3. A dynamic random access memory of a split word line configuration, comprising;
   first and second memory cell arrays having first sides adjacent each other and second sides opposite to each other;
   word lines extending through the first and the second memory cell arrays, each word line being split into first and second sections aligned with each other, respectively extending through the first and the second memory cell arrays, and having their inner ends adjacent each other and their outer ends opposite to each other;
   a first block of word line drive transistors provided between said first sides of the first and the second memory cell arrays;

a second block of word line drive transistors disposed adjacent said second side of the first memory cell array; and a third block of word line drive transistors disposed adjacent said second side of the second memory cell array;

said inner ends of the first and the second sections of the alternate word lines in said first memory cell array and said second memory cell array extending into said first block of word line drive transistors and being connected to the word line drive transistors provided therein; and said outer ends of the first and the second sections of the intervening word lines in said first memory cell array and said second memory cell array extending into said second block of word line drive transistors and said third block of word line drive transistors, respectively, and being connected to the word line drive transistors provided therein.

4. The memory of claim 3, wherein the inner ends of the first and the second sections of each word line are connected through the respective word line drive transistors to a common fixed potential node.

5. The memory of claim 3, wherein the word line drive transistors have gate electrodes provided in said first block and their drains connected to the first and the second sections of each word line are connected to receive an identical signal from a row decoder.

6. The memory of claim 3, wherein the word line drive transistors have gate electrodes provided in said second and third blocks and having their drains connected to the first and the second sections of each word line are connected to receive an identical signal from a row decoder.

7. The memory of claim 3, wherein a plurality of memory cell are connected to each section of each word line.

8. The memory of claim 3, further comprising:
a first group of bit lines extending through the first memory cell array; and
a second group of bit lines extending through the second memory cell array.

9. The memory of claim 2, wherein the inner ends of the first and the second sections of each word line are connected through the respective word line drive transistors to a common fixed potential node.

10. The memory of claim 2, wherein the word line drive transistors have gate electrodes provided in said first block and their drains are connected to the first and the second sections of each word line are connected to receive an identical signal from a row decoder.

11. The memory of claim 2, wherein the word line drive transistors have gate electrodes provided in said second and third blocks and having their drains connected to the first and the second sections of each word line are connected to receive an identical signal from a row decoder.

12. The memory of claim 2, wherein a plurality of memory cells are connected to each section of each word line.

13. The memory of claim 2, further comprising:
a first group of bit lines extending through the first memory cell array; and
a second group of bit lines extending through the second memory cell array.

14. A dynamic random access memory of a split word line configuration, comprising:

first and second memory cell arrays having first sides adjacent each other and second sides opposite to each other;

a set of word lines extending through the first and the second memory cell arrays, each word line being split into first and second sections aligned with each other, respectively extending through the first and the second memory cell arrays, and having inner and outer ends, the inner ends being adjacent each other and the outer ends being opposite each other;

a first block of word line drive transistors provided between said first sides of the first and the second memory cell arrays;

a second block of word line drive transistors disposed adjacent said second side of the first memory cell array; and a third block of word line drive transistors disposed adjacent said second side of the second memory cell array, wherein said first sections of the word lines in said first memory cell array alternate in a sequence having said inner ends extending into said first block of word line drive transistors and connected to the word line drive transistors provided therein and having said outer ends extending into said second block of word line drive transistors and connected to the word line drive transistors provided therein; and said second sections of the word lines in said second memory cell array alternate in a sequence having said inner ends extending into said first block of word line drive transistors and connected to the word line drive transistors provided therein, and having said outer ends extending into said third block of word line drive transistors and connected to the word line drive transistors provided therein.

15. The memory of claim 14, wherein the inner ends of the first and the second sections of each word line are connected through the respective word line drive transistors to a common fixed potential node.

16. The memory of claim 14, wherein the word line drive transistors have gate electrodes and are provided in said first block and having their drains connected to the first and the second sections of each word line are connected to receive an identical signal from a row decoder.

17. The memory of claim 14, wherein the gates of the word line drive transistors provided in said second and said third blocks and having their drains connected to the first and the second sections of each word line are connected to receive an identical signal from a row decoder.

18. The memory of claim 14, wherein a plurality of memory cells are connected to each section of each word line.

19. The memory of claim 14, further comprising:
a first group of bit lines extending through the first memory cell array; and
a second group of bit lines extending through the second memory cell array.

20. A dynamic random access memory of a split word line configuration, comprising:
first and second memory cell arrays having first sides adjacent each other and second sides opposite each other;
word lines extending through the first and the second memory cell arrays, each word line being split into first and second sections aligned with each other, respectively extending through the first and the second memory cell arrays, and having inner and outer ends, the inner ends being adjacent to each other and the outer ends opposite each other;

a first block of word line drive transistors provided between said first side of the first and the second memory cell arrays;

a second block of word line drive transistors disposed adjacent said second side of the first memory cell array; and a third block of word line drive transistors disposed adjacent said second side of the second memory cell array;

the first and the second sections of the word lines in said first memory cell array and said second memory cell array alternate in a sequence having inner ends extending into said first block of word line drive transistors and being connected to the word line drive transistors provided therein, and having said outer ends of the first and the second sections of the word lines in said first memory cell array and said second memory cell array extending into said second block of word line drive transistors and said third block of word line drive transistors, respectively, and being connected to the word line drive transistors provided therein.

21. The memory of claim 20, wherein the inner ends of the first and the second sections of each word line are connected through the respective word line drive transistors to a common fixed potential node.

22. The memory of claim 20, wherein the gates of the word line drive transistors provided in said first block and having their drains connected to the first and the second sections of each word line are connected to receive an identical signal from a row decoder.

23. The memory of claim 20, wherein the gates of the word line drive transistors provided in said second and said third blocks and having their drains connected to the first and the second sections of each word line are connected to receive an identical signal from a row decoder.

24. The memory of claim 20, wherein a plurality of memory cells are connected to each section of each word line.

25. The memory of claim 20, further comprising:
a first group of bit lines extending through the first memory cell array; and
a second group of bit lines extending through the second memory cell array.

26. A dynamic random access memory of a split word line configuration, comprising:
first and second memory cell arrays having first sides adjacent to each other and second sides opposite to each other;
word lines extending through the first and the second memory cell arrays, each word line being split into first and second sections aligned with each other, respectively extending through the first and the second memory cell arrays, and having their inner ends adjacent to each other and their outer ends opposite to each other;
a first block of word line drive transistors provided between said first sides of the first and the second memory cell arrays;
a second block of word line drive transistors disposed adjacent to said second side of the first memory cell array;
a third block of word line drive transistors disposed adjacent to said second side of the second memory cell array;

one of the first sections of the word lines in said first memory cell array adjacent to each other having its inner end extending into said first block of word line drive transistors and connected to the word line drive transistors provided therein;

the other of said first sections of the word lines in said first memory cell array adjacent to each other having its outer ends extending into said second block of word line drive transistors and connected to the word line drive transistors provided therein;

one of the second sections of the word lines in said second memory cell array adjacent to each other having its inner ends extending into said first block of word line drive transistors and connected to the word line drive transistors provided therein; and the other of said second sections of the word lines in said second memory cell array adjacent to each other having its outer ends extending into said third block of word line drive transistors and connected to the word line drive transistors provided therein.

27. The memory of claim 26, wherein the inner ends of the first and the second sections of each word line are connected through the respective word line drive transistors to a common fixed potential node.

28. The memory of claim 26, wherein the word line drive transistors having gate electrodes provided in said first block and their drains connected to the first and the second sections of each word line are connected to receive an identical signal from a row decoder.

29. The memory of claim 26, wherein the word line drive transistors have gate electrodes provided in said second and third blocks and their drains connected to the first and the second sections of each word line are connected to receive an identical signal from a row decoder.

30. The memory of claim 26, wherein a plurality of memory cell are connected to each section of each word line.

31. The memory of claim 26, further comprising:
a first group of bit lines extending through the first memory cell array; and
a second group of bit lines extending through the second memory cell array.

32. A dynamic random access memory of a split word line configuration, comprising:
first and second memory cell arrays having first sides adjacent to each other and second sides opposite to each other;
word lines extending through the first and the second memory cell arrays, each word line being split into first and second sections aligned with each other, respectively extending through the first and the second memory cell arrays, and having their inner ends adjacent to each other and their outer ends opposite to each other;
a first block of word line drive transistors provided between said first sides of the first and the second memory cell arrays;
a second block of word line drive transistors disposed adjacent to said second side of the first memory cell array;
a third block of word line drive transistors disposed adjacent to said second side of the second memory cell array;

said inner ends of the first and the second sections of one of the word lines adjacent to each other extending into said first block of word line drive transistors being connected to the word line drive transistors provided therein; and said outer ends of the first and the second sections of the other of the word lines adjacent to each other extending into said second block of word line drive transistors and said third block of word line drive transistors, respectively, and being connected to the word line drive transistors provided therein.

33. The memory of claim 32, wherein the inner ends of the first and the second sections of each word line are connected through the respective word line drive transistors to a common fixed potential node.

34. The memory of claim 32, wherein the word line drive transistors have gate electrodes provided in said first block and their drains connected to the first and the second sections of each word line are connected to receive an identical signal from a row decoder.

35. The memory of claim 32, wherein the word line drive transistors have gate electrodes provided in said second and third blocks and having their drains connected to the first and the second sections of each word line are connected to receive an identical signal from a row decoder.

36. The memory of claim 32, wherein a plurality of memory cell are connected to each section of each word line.

37. The memory of claim 32, further comprising:
a first group of bit lines extending through the first memory cell array; and
a second group of bit lines extending through the second memory cell array.

38. A dynamic random access memory comprising:
a first memory cell array having first and second sides, the first side being opposite to the second side;
a second memory cell array having third and fourth sides, the third side being opposite to the fourth side;
said first and second memory cell arrays being aligned side by side so that the second and third sides being adjacent to each other;
a first group of word lines including a first word line therein;
a second group of word lines including a second word line therein, said second word line being adjacent to said first word line;
said first and second groups of word lines each extending through said first and second memory cell arrays and being split into first and second sections aligned with each other, the first sections each extending through said first memory cell array, the second sections each extending through said second memory cell array;
a first group of word line drive transistors provided between the second and third sides and coupled to both of the first and second sections in said first group of word lines;
a second group of word line drive transistors provided adjacent to the first side and coupled to the first sections in said second group of word lines; and a third group of word line drive transistors provided adjacent to the fourth side and coupled to the second sections in said second group of word lines.

39. The memory according to claim 38, wherein the first and second sections of said first word line are commonly driven by a word line drive transistor in said first group of the word line drive transistors;
wherein the first section of said second word line is driven by a word line drive transistor in said second group of the word line drive transistors; and
wherein the second section of said second word line is driven by a word line drive transistor in said third group of the word line drive transistor.

40. A dynamic random access memory comprising:
a first memory cell array having first and second sides, the first side being opposite to the second side;
a second memory cell array having third and fourth sides, the third side being opposite to the fourth side;
said first and second memory cell arrays being aligned side by side so that the second and third sides are adjacent to each other;
a first group of word lines including first and third word lines therein;
a second group of word lines including second and fourth word line therein, said second word line being provided between said first and third word line in said first group of the word lines, said third word line being provided between said second and fourth word line in said second group of the word lines;
said first and second groups of word lines each extending through said first and second memory cell arrays and being split into first and second sections aligned with each other, the first sections each extending through said first memory cell array, the second sections each extending through said second memory cell array;
a first group of word line drive transistors provided between the second and third sides and coupled to both of the first and second sections in said first group of word lines;
a second group of word line drive transistors provided adjacent to the first side and coupled to the first sections in said second group of word lines; and
a third group of word line drive transistors provided adjacent to the fourth side and coupled to the second sections in said second group of word lines.

41. The memory according to claim 39, wherein the first and second sections of said first and third word lines are respectively commonly driven by corresponding word line drive transistors adjacent to each other in said first group of the word line drive transistors;
wherein the first sections of said second and fourth word lines are respectively driven by corresponding word line drive transistors adjacent to each other in said second group of the word line drive transistors; and
wherein the second sections of said second and fourth word lines are respectively driven by corresponding word line drive transistors adjacent to each other in said third group of the word line drive transistors.

* * * * *